US007773648B2

(12) United States Patent
Tachibana et al.

(10) Patent No.: US 7,773,648 B2
(45) Date of Patent: Aug. 10, 2010

(54) SEMICONDUCTOR DEVICE AND METHOD FOR MANUFACTURING THE SAME

(75) Inventors: Koichi Tachibana, Kawasaki (JP); Shinji Saito, Yokohama (JP); Shinya Nunoue, Ichikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/365,531

(22) Filed: Mar. 2, 2006

(65) Prior Publication Data
US 2007/0014323 A1 Jan. 18, 2007

(30) Foreign Application Priority Data
Jul. 13, 2005 (JP) .............................. 2005-204436

(51) Int. Cl.
*H01S 3/04* (2006.01)
*H01S 5/00* (2006.01)
(52) U.S. Cl. .................................................. 372/43.01
(58) Field of Classification Search ............... 372/43.01
See application file for complete search history.

(56) References Cited

U.S. PATENT DOCUMENTS

| | | | | |
|---|---|---|---|---|
| 4,656,638 A * | 4/1987 | Tihanyi et al. | ........... | 372/49.01 |
| 5,260,231 A * | 11/1993 | Kawanishi et al. | ............. | 438/38 |
| 6,067,310 A * | 5/2000 | Hashimoto et al. | ........ | 372/49.01 |
| 6,249,534 B1 * | 6/2001 | Itoh et al. | ................ | 372/49.01 |
| 6,323,052 B1 * | 11/2001 | Horie et al. | ................... | 438/46 |
| 6,411,636 B1 * | 6/2002 | Ota et al. | ................. | 372/43.01 |
| 6,441,444 B1 * | 8/2002 | Tsuji et al. | .................. | 257/374 |
| 6,529,537 B2 * | 3/2003 | Yamanaka | ............... | 372/49.01 |
| 6,590,920 B1 * | 7/2003 | McElhinney et al. | ..... | 372/49.01 |
| 6,798,805 B2 * | 9/2004 | Yamanaka | ............... | 372/43.01 |
| 6,809,344 B2 * | 10/2004 | Osaka | ......................... | 257/98 |
| 6,850,547 B2 * | 2/2005 | Goto | ....................... | 372/43.01 |

(Continued)

FOREIGN PATENT DOCUMENTS

JP 58-125832 7/1983

(Continued)

OTHER PUBLICATIONS

Accuratus, "SiAION", 2002, www.accuratus.com/sialon.html.*

(Continued)

*Primary Examiner*—Minsun Harvey
*Assistant Examiner*—Joshua King
(74) *Attorney, Agent, or Firm*—Oblon, Spivak, McClelland, Maier & Neustadt, L.L.P.

(57) ABSTRACT

Disclosed herein is a high-reliability semiconductor device. The laser diode includes: a substrate; a multi-layer film including a first conductivity type cladding layer provided on the substrate, a first conductivity type guide layer provided on the first conductivity type cladding layer, an active layer provided on the first conductivity type guide layer, a second conductivity type guide layer provided on the active layer, and a second conductivity type cladding layer provided on the second conductivity type guide layer, each of the layers being made of a nitride-based III-V group compound semiconductor; a first protective layer made of nitride and provided on a light emitting surface of the laser diode; and a second protective layer provided on the first protective layer and made of nitride having a refractive index different from that of the first protective layer.

22 Claims, 4 Drawing Sheets

U.S. PATENT DOCUMENTS

| | | | |
|---|---|---|---|
| 6,990,133 B2 * | 1/2006 | Kikawa et al. | 372/49.01 |
| 7,065,117 B2 * | 6/2006 | Yamanaka | 372/49.01 |
| 7,113,530 B2 * | 9/2006 | Matsumoto et al. | 372/43.01 |
| 2002/0001864 A1 * | 1/2002 | Ishikawa et al. | 438/22 |
| 2002/0167014 A1 * | 11/2002 | Schlereth et al. | 257/79 |
| 2003/0123506 A1 * | 7/2003 | Yamanaka | 372/49 |
| 2004/0105473 A1 * | 6/2004 | Tojo et al. | 372/45 |
| 2004/0251471 A1 * | 12/2004 | Dwilinski et al. | 257/103 |
| 2006/0133442 A1 * | 6/2006 | Kondou et al. | 372/49.01 |

FOREIGN PATENT DOCUMENTS

| | | |
|---|---|---|
| JP | 03-142892 | 6/1991 |
| JP | 09-064453 | 3/1997 |
| JP | 2002-026442 | 1/2002 |
| JP | 2002-26442 | 1/2002 |
| JP | 2002-204036 | 7/2002 |
| JP | 2002-237648 | 8/2002 |
| JP | 2002-237660 | 8/2002 |
| JP | 2003-023180 | 1/2003 |
| JP | 2004-266057 | 9/2004 |
| WO | WO03/036771 | 5/2003 |

OTHER PUBLICATIONS

Kazuhiko Itaya, et al., "Effect of Facet Coating on the Reliability of InGaAlP Visible Light Laser Diodes", Applied Physics Letters, vol. 53, No. 15, Oct. 10, 1988, pp. 1363-1365.

U.S. Appl. No. 12/039,303, filed Feb. 28, 2008, Tachibana, et al.

* cited by examiner

SEMICONDUCTOR DEVICE AND METHOD FOR MANUFACTURING THE SAME

CROSS-REFERENCE TO RELATED APPLICATION

This application is based upon and claims the benefit of priority from prior Japanese Patent Application No. 2005-204436 filed on Jul. 13, 2005 in Japan, the entire contents of which are incorporated herein by reference.

BACKGROUND OF THE INVENTION

1. Field of the Invention

The present invention relates to a semiconductor device and a method for manufacturing the same, and more particularly to a gallium nitride-based semiconductor device and a method for manufacturing the same.

2. Related Art

Nitride-based III-V group compound semiconductors such as gallium nitride (GaN) have a wide band gap, and such a characteristic is utilized to research and develop high-intensity ultraviolet to blue/green light emitting diodes and blue-violet laser diodes. Further, high-frequency and high-power field-effect transistors using nitride-based III-V group compound semiconductors have been manufactured.

The layer structure of a III-V group compound semiconductor device is formed by crystal growth. In general, the surface of a semiconductor crystal is not directly exposed to air or the like, and is coated with, for example, a metal electrode or a protective film made of $Al_2O_3$ or $SiO_2$. Such a protective film prevents the deterioration of device characteristics. For example, in the case of a laser diode, a cleaved surface is used as a reflector. If such a cleaved surface is not coated with some kind of a protective film, moisture, organic or inorganic matter, and the like contaminate the cleaved surface so that the refractive index thereof is changed, thereby causing fluctuations in reflectivity. Fluctuations in reflectivity change the characteristics of the laser diode, thus deteriorating device reliability. Therefore, based on expertise in laser diodes using GaAs-based or InGaAlP-based materials, an $Al_2O_3$ film has often been used as a film for protecting a cleaved surface (see, for example, K. Itaya et al.,"Effect of facet coating on the reliability of InGaAlP visible light laser diodes", Applied Physics Letters, vol. 53, no. 15, pp. 1363-1365, Oct. 10, 1988).

The present inventors have manufactured a nitride-based III-V group compound semiconductor blue-violet laser diode using an $Al_2O_3$ film as a film for protecting a cleaved surface. However, the lifetime of the device was about 700 hours when measured under the conditions required for high-speed disc recording, that is, at an optical output of 60 mW in a continuous wave mode (or at an optical output of 120 mW in a pulse oscillation mode). Then, the end face of the device was observed with an electron microscope, and was found to be deteriorated. The reason for this can be considered as follows. The wavelength of blue-violet laser light is shorter than that of near-infrared laser light emitted from a GaAs-based laser diode or red laser light emitted from an InGaAlP-based laser diode, and therefore blue-violet laser light has higher photon energy, thereby causing damage to the protective film made of $Al_2O_3$.

Meanwhile, a method for prolonging the lifetime of a nitride semiconductor laser diode has been proposed (see, for example, Japanese Patent Laid-open Publication No. 2002-237648). In this method, an SiN film is formed on both resonator end faces of a nitride semiconductor laser diode so as to have a thickness of about 1 nm, and then a low-reflection coating of $SiO_2$ is applied onto one resonator end face and a high-reflection coating of $SiO_2/TiO_2$ is applied onto the other resonator end face. According to this method, the lifetime of the nitride semiconductor laser diode measured at an optical output of 1 mW at an operating temperature of 50° C. is prolonged to several hundred hours. However, this method cannot prolong the lifetime of the nitride semiconductor laser diode at a high optical output of 60 mW in a continuous wave mode (or at an optical output of 120 mW in a pulse oscillation mode).

Further, there is known a method in which a single crystal film of $Al_xGa_{1-x}N$ ($0 \leq x \leq 1$) is formed on a resonator end face or faces of a nitride semiconductor laser device (see, for example, WO 03/036771). However, according to this method, the semiconductor device is heated in an apparatus for forming a single crystal film before a single crystal film is formed on the end face of the device, and therefore the end face of the device is oxidized by oxygen remaining in the apparatus, thus deteriorating the end face of the nitride semiconductor device. In this case, even if a film is formed on such a deteriorated end face, it is impossible to improve the reliability of the semiconductor device.

As has been described above, according to the conventional technology, it is difficult to obtain a high-reliability semiconductor device comprising nitride-based III-V group compound semiconductor layers.

SUMMARY OF THE INVENTION

Under the circumstances, it is an object of the present invention to provide a high-reliability semiconductor device comprising nitride-based III-V group compound semiconductor layers.

A laser diode according to a first aspect of the present invention includes: a substrate; a multi-layer film including a first conductivity type cladding layer provided on the substrate, a first conductivity type guide layer provided on the first conductivity type cladding layer, an active layer provided on the first conductivity type guide layer, a second conductivity type guide layer provided on the active layer, and a second conductivity type cladding layer provided on the second conductivity type guide layer, each of the layers being made of a nitride-based III-V group compound semiconductor; a first protective layer made of nitride and provided on a light emitting surface of the diode; and a second protective layer provided on the first protective layer and made of nitride having a refractive index different from that of the first protective layer.

A light emitting diode according to a second aspect of the present invention includes: a substrate, a multi-layer film including a first conductivity type semiconductor layer provided on the substrate, an active layer provided on the first conductivity type semiconductor layer, and a second conductivity type semiconductor layer provided on the active layer, each of the layers being made of a nitride-based III-V group compound semiconductor; a first protective layer made of nitride and provided on a side face of the light emitting diode; and a second protective layer provided on the first protective layer and made of nitride having a refractive index different from that of the first protective layer.

A semiconductor device according to a third aspect of the present invention includes: a nitride-based III-V group compound semiconductor layer provided on a substrate; a first protective layer made of nitride and provided on a side face of the nitride-based III-V group compound semiconductor layer; and a second protective layer provided on the first protective layer and made of nitride having a refractive index different from that of the first protective layer.

Each of the first and second protective layers can have a thickness of 0.25 nm or more but 50 nm or less.

The first protective layer can have a heat conductivity higher than that of the second protective layer and the second protective layer can be made of a material having a higher resistance to oxidation than that of the first protective layer.

The first protective layer can be made of either aluminum nitride or silicon aluminum nitride.

In a case where the first protective layer is be made of aluminum nitride, the second protective layer can be made of silicon nitride or silicon aluminum nitride and in a case where the first protective layer is made of silicon aluminum nitride, the second protective layer can be made of silicon nitride.

The first protective layer can be provided on a $\{1\text{-}100\}$ plane.

The substrate can be a GaN substrate.

A method for manufacturing a semiconductor device according to a fourth aspect of the present invention includes: forming nitride-based III-V group compound semiconductor layers on a substrate; forming a first protective layer made of nitride on a side face of the nitride-based III-V group compound semiconductor layers; and forming a second protective layer made of nitride having a refractive index different from that of the first protective layer on the first protective layer.

The first and second protective layers can be formed by an ECR sputtering method.

The method can further include subjecting the side face of the nitride-based III-V group compound semiconductor layer to nitriding treatment before the formation of the first protective layer.

DETAILED DESCRIPTION OF THE INVENTION

Hereinbelow, embodiments of the present invention will be described with reference to the accompanying drawings.

First Embodiment

Figure 1:
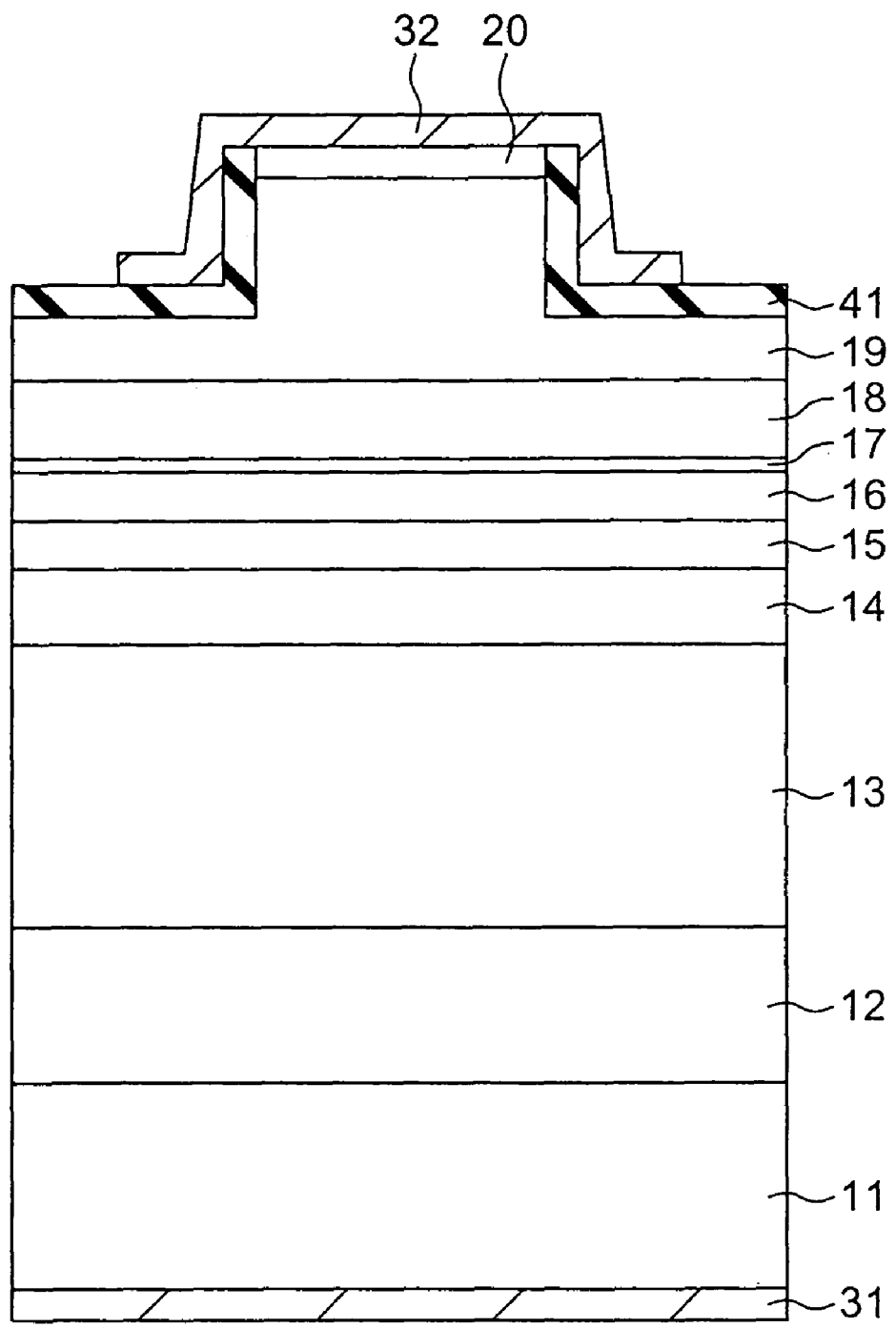
FIG. 1 is a schematic view which shows a cross-sectional structure of a semiconductor device (i.e., a laser diode) according to a first embodiment of the present invention.

FIG. 1 is a cross-sectional view of a semiconductor device according to a first embodiment of the present invention. The semiconductor device of this embodiment is formed in the following manner.

First, an n-type impurity-doped n-type semiconductor layer (i.e., an n-type GaN buffer layer) 12 is formed by crystal growth on an n-type GaN $\{0001\}$ substrate 11. In this case, crystal growth is carried out by an MOCVD (Metal Organic Chemical Vapor Deposition) method, but an MBE (Molecular Beam Epitaxy) method may alternatively be employed. Examples of an n-type impurity to be used include Si and Ge. In this embodiment, Si is used. It is to be noted that the brackets "$\{\ \}$" represent a plane. For example, a $\{1\text{-}100\}$ plane means a $(1\text{-}100)$ plane, and the $(1\text{-}100)$ plane is equivalent to a $(10\text{-}10)$, $(-1100)$, $(-1010)$, $(01\text{-}10)$ or $(0\text{-}110)$ plane. Therefore, all these planes are inclusively represented by "$\{1\text{-}100\}$" for convenience in writing. Here, the mark "-(bar)" is attached to a numeral just behind the mark "-", and the same goes for direction which will be described later.

On the n-type GaN buffer layer 12, an n-type cladding layer 13 is grown. This n-type cladding layer 13 is a superlattice composed of an undoped $Ga_{0.9}Al_{0.1}N$ layer and a GaN layer doped with an n-type impurity at a concentration of about $1\times10^{18} cm^{-3}$. The n-type cladding layer 13 is not limited thereto, and may be, for example, an n-type impurity-doped thick film made of $Ga_{0.95}Al_{0.05}N$ (film thickness: about 1.5 μm). As described above, in this embodiment, a superlattice composed of the undoped $Ga_{0.9}Al_{0.1}N$ layer and the GaN layer doped with an n-type impurity at a concentration of about $1\times10^{18} cm^{-3}$ is used as the n-type cladding layer 13, but both of the $Ga_{0.9}Al_{0.1}N$ layer and the GaN layer may be doped with an n-type impurity.

On the n-type cladding layer 13, an n-type guide layer 14 of GaN doped with an n-type impurity at a concentration of about $1\times10^{18} cm^{-3}$ is grown so as to have a thickness of about 0.1 μm. Alternatively, an $In_{0.01}Ga_{0.99}N$ film having a thickness of about 0.1 μm may be used as the n-type guide layer 14.

On the n-type guide layer 14, an active layer 15 is grown. The active layer 15 has an MQW (Multiple Quantum Well) structure in which three undoped quantum well layers of $In_{0.1}Ga_{0.9}N$ having a thickness of about 3.5 nm and undoped barrier layers of $In0.01Ga099N$ having a thickness of about 7 nm are alternately stacked so that each of the quantum well layers is sandwiched between the barrier layers.

On the active layer 15, a first guide layer 16 made of p-type GaN is grown so as to have a thickness of 0.03 μm.

On the first guide layer 16, an overflow prevention layer 17 is grown. The overflow prevention layer 17 is a $Ga_{0.8}Al_{0.2}N$ layer doped with a p-type impurity element at a concentration of about $5\times10^{18} cm^{-3}$ and having a thickness of about 10 nm, and functions as a layer for preventing the overflow of electrons. Examples of a p-type impurity to be used include Mg and Zn. In this embodiment, Mg is used.

On the overflow prevention layer 17, a second guide layer 18 made of p-type GaN is grown. In this embodiment, the second guide layer 18 is a GaN layer doped with a p-type impurity element at a concentration of about $5\times10^{18} cm^{-3}$ to $10\times10^{18} cm^{-3}$ and having a thickness of about 0.1 μm. More generally, for example, a p-type nitride-based III-V group compound semiconductor layer of $In_xGa_{1-x-y}Al_yN$ ($0\leqq x\leqq 1$, $0\leqq y\leqq 1$) may be used.

On the second guide layer 18, a p-type cladding layer 19 is grown. In this embodiment, the p-type cladding layer 19 is a superlattice composed of an undoped $Ga_{0.9}Al_{0.1}N$ layer and a p-type impurity-doped GaN layer. However, the p-type cladding layer 19 is not limited thereto, and may be, for example, a p-type impurity-doped thick film made of $Ga_{0.95}Al_{0.05}N$ (film thickness: about 0.6 μm). As described above, in this embodiment, a superlattice composed of the undoped $Ga_{0.9}Al_{0.1}N$ and the p-type impurity-doped GaN is used as the p-type cladding layer 19, but both of $Ga_{0.9}Al_{0.1}N$ and GaN may be doped with a p-type impurity.

On the p-type cladding layer 19, a contact layer 20 made of p-type GaN is grown. In this embodiment, the contact layer 20 is a p-type impurity-doped GaN layer having a thickness of about 0.1 µm, but may be, for example, a p-type impurity-doped layer of $In_xGa_{1-x-y}Al_yN$ ($0 \leq x \leq 1$, $0 \leq y \leq 1$).

Such a wafer prepared by crystal growth is subjected to a device process to manufacture a laser diode.

As shown in FIG. 1, a laminated structure of the p-type cladding layer 19 and the p-type contact layer 20 has a convex portion formed from the p-type cladding layer 19 and the p-type contact layer 20 in the middle thereof and a flat portion of the p-type cladding layer 19 adjacent to the convex portion. That is, the p-type cladding layer 19 and the p-type contact layer 20 form a stepped structure (i.e., a ridge structure) composed of a convex portion and a flat portion. The convex portion of the laminated structure composed of the p-type cladding layer 19 and the p-type GaN contact layer 20 extends in a direction perpendicular to the plane of the sheet of FIG. 1, and functions as a resonator. It is to be noted that the cross-sectional shape of the convex portion of the laminated structure is not limited to a rectangle having a vertical side wall as shown in FIG. 1, and may alternatively be a trapezoid having a slope, such as a mesa shape. The width of the p-type contact layer 20 (that is, the width of a ridge) is about 2 µm. The direction of the resonator (that is, a direction perpendicular to the plane of the sheet of FIG. 1) is adjusted to a <1-100> direction of the nitride-based III-V group compound semiconductor. Here, the <1-100> direction means a [1-100] direction, and the [1-100] direction is equivalent to a [10-10], [-1100], [-1010], [01-10] or [0-110] direction. Therefore, all these directions are inclusively represented by "<1-100>" for convenience in writing.

On the side faces of the convex portion and the flat portion of the p-type cladding layer 19 adjacent to the convex portion, an insulation film is formed as a current blocking layer 41 so as to sandwich the ridge (i.e., so as to sandwich the convex portion). The current blocking layer 41 controls the transverse mode. The thickness of the current blocking layer 41 can be arbitrarily selected depending on design, but is preferably set to about 0.3 µm to 0.6 µm, e.g., about 0.5 µm. As the current blocking layer 41, a high-specific resistance semiconductor film such as an AlN film or a $Ga_{0.8}Al_{0.2}N$ film, a semiconductor film irradiated with protons, a silicon dioxide film (i.e., an $SiO_2$ film), a zirconium dioxide film (i.e., a $ZrO_2$ film) or the like can be used. Alternatively, a multilayer film composed of, for example, a $SiO_2$ film and a $ZrO_2$ film may be used. Namely, for the current blocking layer 41, various materials can be used as long as they have a refractive index lower than that of the nitride-based III-V group compound semiconductor used for the active layer 15. In this embodiment, a ridge waveguide laser structure is employed, but a buried-type laser structure may alternatively be employed. In the case of a buried-type laser structure, an n-type semiconductor layer such as n-type GaN or n-type GaAlN is used instead of the insulation film for PN-junction separation so as to function as a current blocking layer.

On the p-type GaN contact layer 20, a p-side electrode 32 formed from, for example, a composite film (i.e., a laminated film) of palladium/platinum/gold (Pd/Pt/Au) is provided. The thicknesses of the Pd film, Pt film, and Au film are, for example, 0.05 µm, 0.05 µm, and 1.0 µm, respectively. On the back surface of the n-type GaN substrate 11, an n-side electrode 31 formed from, for example, a composite film (i.e., a laminated film) of titanium/platinum/gold (Ti/Pt/Au) is provided. The n-side electrode 31 can be formed from, for example, a Ti film having a thickness of 0.05 µm, a Pt film having a thickness of 0.05 µm, and an Au film having a thickness of 1.0 µm.

A resonator is formed by cleavage. Specifically, cleaved surfaces are used as both end faces of a resonator to function as reflectors of the laser. Here, a cleavage plane is a {1-100} plane of the nitride-based III-V group compound semiconductor. The length of the resonator is, for example, 600 µm.

Figure 2:
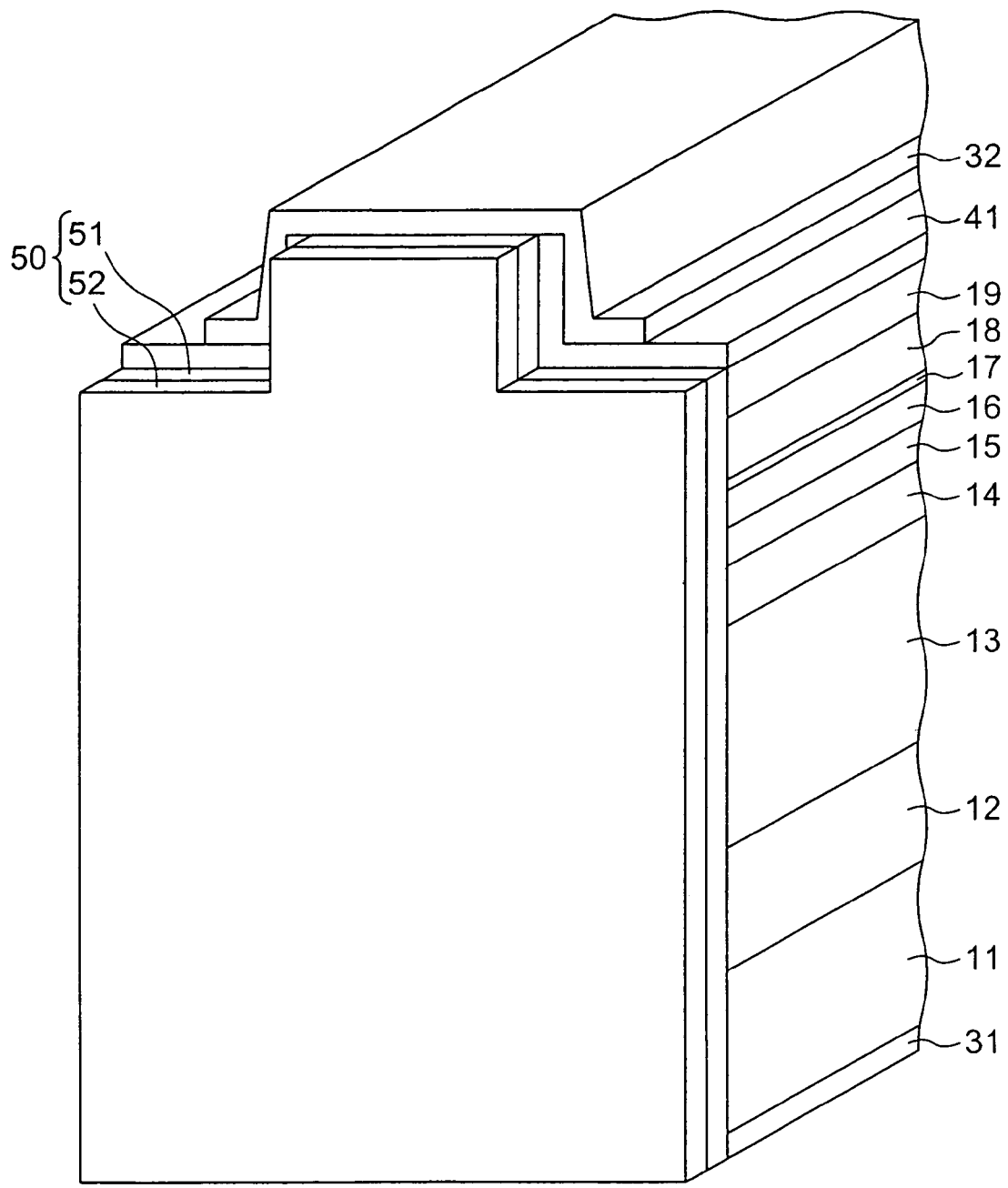
FIG. 2 is a perspective view which shows the end portion of the semiconductor device (i.e., a laser diode) according to the first embodiment of the present invention.

If the cleaved surfaces are left as they are, air, organic matter or inorganic matter, and the like contaminate the cleaved surfaces. Even if the semiconductor device can be sealed in a package with little influence of contaminants on the cleaved surfaces, organic or inorganic matter is attracted to the cleaved surfaces by laser light emitted from the laser diode by the passage of electric current. For this reason, it is necessary to provide some kind of a protective film on the cleaved surface or surfaces of the nitride-based III-V group compound semiconductor. In this embodiment, as shown in FIG. 2, a protective film 50 is formed on the {1-100} plane of the nitride-based III-V group compound semiconductor. The protective film 50 is composed of an AlN layer 51 provided on the {1-100} plane of the nitride-based III-V group compound semiconductor and an $Si_3N_4$ (silicon nitride) layer 52 provided on the AlN layer 51 so as to have a refractive index different from that of AlN. The AlN layer and the $Si_3N_4$ layer are formed by an ECR (Electron Cyclotron Resonance) sputtering method. It is to be noted that a method for forming such a nitride protective film is not limited to an ECR sputtering method, and other film formation methods may alternatively be employed.

Usually, one of the cleaved surfaces functions as a surface from which laser light is extracted (hereinafter, simply referred to as a "light emitting surface") and the other cleaved surface functions as a reflection surface. The nitride protective film is formed on one or both of the light emitting surface and the reflection surface. Preferably, the nitride protective film is formed on the light emitting surface.

Figure 3:
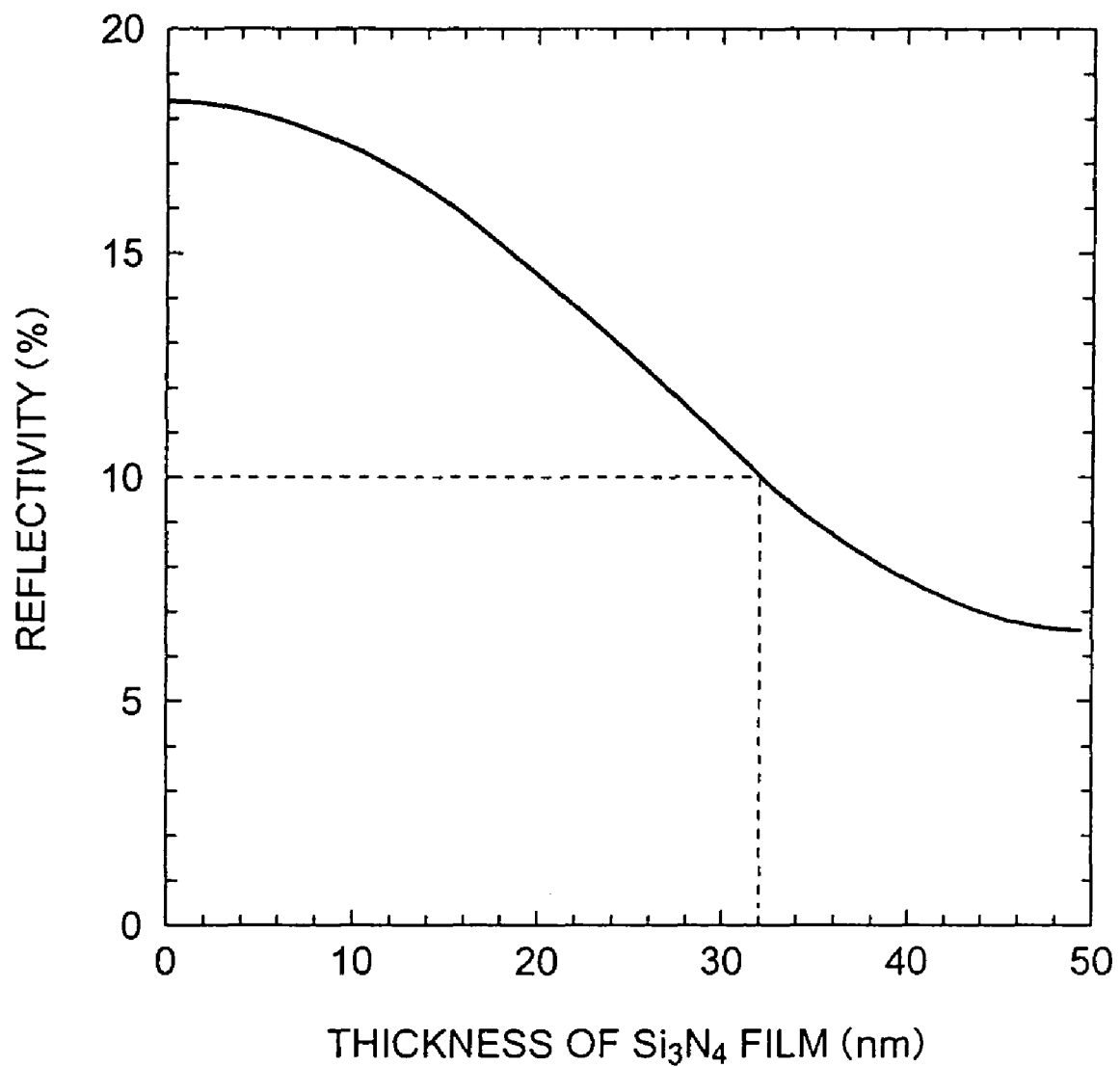
FIG. 3 is a graph which shows the dependence of reflectivity of a light emitting end face of the blue-violet laser diode according to the first embodiment on thickness of an $Si_3N_4$ film formed on an AlN film formed on the light emitting end face of the laser diode so as to have a thickness of 0.25 nm.

In this embodiment, the oscillation wavelength of the blue-violet laser diode is set to 405 nm. The refractive index of AlN ($n_{AlN}$) at a wavelength of 405 nm is 2.16, and the refractive index of $Si_3N_4$ ($n_{Si3N4}$) at a wavelength of 405 nm is 2.06. FIG. 3 shows the reflectivity of the light emitting surface calculated when the thickness of the AlN layer is kept constant (i.e., 0.25 nm) while changing the thickness of the $Si_3N_4$ layer. For example, in order to allow the light emitting surface to have a reflectivity of 10%, the thickness of the $Si_3N_4$ layer should be set to 32 nm when the thickness of the AlN layer is 0.25 nm as can be seen from FIG. 3. In a case where an AlN film is intended to be formed on the reflection surface, an AlN film and an $Si_3N_4$ film are formed in such a manner that each of the films has a thickness of about 0.25 nm, and then a dielectric multilayer composed of films having different refractive indexes, such as $SiO_2$ and $ZrO_2$ films or $SiO_2$ and $Si_3N_4$ films, is formed so that the reflectivity of the reflection surface becomes about 95%.

The threshold current of the semiconductor device (i.e., a laser diode) of this embodiment was 30 mA on average. The reflectivity of the light emitting surface was 10%, the thickness of the AlN layer 51 was 0.25 nm, and the thickness of the $Si_3N_4$ layer 52 was 32 nm.

As a first comparative example, a laser diode was manufactured so as to have the same structure as the first embodiment except that the material of the end face protective film was changed. The end face protective film of the laser diode of the first comparative example was formed using $Al_2O_3$ so that the reflectivity of the light emitting surface was 10%. The threshold current of the laser diode of this comparative example was also 30 mA on average. As described above, there was no change between the first embodiment and the first comparative example as far as their initial characteristics were concerned.

Then, a life test was performed on each of the laser diodes while keeping the optical output thereof constant. In this life test, a change in operating current was checked at an optical output of 60 mW at an operating temperature of 60° C. in a continuous wave mode, and the time that elapsed before the operating current was increased by 20% was defined as a lifetime. The lifetime of the laser diode of the first comparative example was 700 hours on average. On the other hand, the lifetime of the laser doide of the first embodiment having the end face protective film 50 composed of the AlN layer 51 and the $Si_3N_4$ layer 52 was 4,000 hours or longer on average. That is, the lifetime of the laser diode of the first embodiment was significantly prolonged.

The single crystal of AlN has a very large band gap energy, 6.2 eV (i.e., 200 nm in terms of wavelength), and therefore it can be considered that the end face protective film is not easily deteriorated by light absorption even in the case of laser light having a wavelength of 405 nm. In addition to that, AlN is a material having a very high heat conductivity. Therefore, by forming a protective film made of AlN on the end face of the semiconductor device, it is possible to efficiently release heat generated in the semiconductor device. Further, since the AlN film formed on the end face of the nitride semiconductor device is also a nitride semiconductor, the stoichiometry (compositional ratio) of the end face is not easily altered. Furthermore, when the temperature of the semiconductor device is decreased to room temperature after the AlN film is formed by ECR sputtering, distortion occurs in the {1-100} plane of the semiconductor device because of the difference in coefficient of linear expansion between the semiconductor device comprising the nitride-based III-V group compound semiconductor single crystal and the end face protective film of AlN formed on the {1-100} plane. As a result, the band gap energy of the end face is changed so that it is possible to suppress light absorption at the end face.

Further, by further forming the $Si_3N_4$ film on the end face protective film made of AlN, it is possible to significantly suppress the deterioration of the end face because as compared to AlN, $Si_3N_4$ has a higher ability to prevent adsorption of contaminants such as organic or inorganic matter which exist in a package and are attracted to the end face by laser light.

Furthermore, the $Si_3N_4$ film is one of nitride films having a high resistance to oxidation, and therefore the protective film made of $Si_3N_4$ is not deteriorated by oxygen remaining in the semiconductor device sealed in a package. On the other hand, the AlN film is a nitride film which is likely to be oxidized in some degree, and therefore in a case where only the AlN film is formed as a protective film on the end face of the semiconductor device, AlN is oxidized by oxygen remaining in the package to generate AlNOx, that is, reaction occurs at the end face of the laser diode. As a result, it can be considered that the reflectivity of the end face fluctuates and a light absorption layer is formed in the end face so that the reliability of the laser diode is impaired. For this reason, it is preferred that the end face protective film 50 having a multilayer structure comprising a first protective layer made of AlN and a second protective layer made of $Si_3N_4$ be used to ensure the middle- and long-term reliability of the semiconductor device.

As a second comparative example, a laser diode having an end face protective film comprising a first protective layer made of AlN and a second protective layer made of $SiO_2$ was manufactured in such a manner that the end face protective film was brought into contact with a nitride semiconductor and the reflectivity of a light emitting surface was 10%. The laser diode of the second comparative example was manufactured so as to have the same structure as the first embodiment except that the material of the end face protective film was changed. The threshold current of the laser diode of the second comparative example was about 30 mA on average. However, the lifetime of the laser diode of the second comparative example was about 900 hours when measured at an optical output of 60 mW at an operating temperature of 60° C. in a continuous wave mode. The lifetime of the laser diode of the second comparative example was slightly prolonged as compared to that of the laser diode of the first comparative example having the end face protective film comprising a single layer film of $Al_2O_3$. The reason for this can be considered as follows. The first protective layer made of AlN makes it possible to efficiently release heat generated in the semiconductor device, but the constituent element of the second protective layer made of $SiO_2$, or oxygen reacts with AlN to produce AlNOx, that is, reaction occurs at the end face of the laser diode. As a result, the reflectivity of the end face fluctuates and a light absorption layer is formed in the end face so that the reliability of the laser diode is impaired.

As has been described above, according to the first embodiment, by forming a plurality of nitride protective films having different refractive indexes on a {1-100} plane of a semiconductor device comprising a nitride-based III-V group compound semiconductor provided on a GaN substrate, it is possible to prevent the deterioration of the {1-100} plane, thereby enabling a high-reliability semiconductor device to be obtained.

(Modification of the First Embodiment)

As a modification of the first embodiment, a laser diode was manufactured in the same manner as in the first embodiment except that the end face of the semiconductor device was subjected to nitrogen plasma treatment in an ECR sputtering apparatus before the nitride protective film was formed on the end face. The lifetime of the laser diode of the modification of the first embodiment was 5,000 hours or longer when measured under the same conditions as described above, that is, at optical output of 60 mW at an operating temperature of 60° C. in a continuous wave mode. That is, the lifetime of the laser diode of the modification of the first embodiment was further prolonged as compared to that of the laser diode of the first embodiment. The reason for this can be considered that nitrogen plasma treatment has the function of recovering the stoichiometry of N removed from the {1-100} plane.

It should be noted that it is not preferred that the temperature of the end face be increased to a value higher than 400° C. when nitrogen plasma treatment is carried out. This is because if the temperature exceeds 400° C before the protective film is formed on the end face, the end face is oxidized by oxygen remaining in the ECR sputtering apparatus, thus deteriorating the end face of the nitride semiconductor device. In this case, even if the protective film is formed on such a deteriorated end face, it is difficult to obtain a high-reliability semiconductor device.

Second Embodiment

Next, a semiconductor device according to a second embodiment of the present invention will be described with reference to FIG. 4.

The semiconductor device according to the second embodiment is manufactured in the following manner.

First, an n-type impurity-doped n-type semiconductor layer (i.e., an n-type GaN buffer layer) 112 is formed by crystal growth on an n-type GaN {0001} substrate 111. In this case, crystal growth is carried out by an MOCVD (Metal Organic Chemical Vapor Deposition) method, but an MBE (Molecular Beam Epitaxy) method may alternatively be employed. Examples of n-type impurities to be used include Si and Ge. In this case, Si is used.

On the buffer layer 112, an n-type guide layer 113 of GaN doped with an n-type impurity at a level of about $1\times10^{18}$ cm$^{-3}$ is grown so as to have a thickness of about 0.1 µm. Alternatively, an $In_{0.01}Ga_{0.99}N$ film having a thickness of about 0.1 µm may be used as the n-type guide layer 113. It is to be noted that an n-type cladding layer made of, for example, $Ga_{0.95}Al_{0.005}N$ may be grown so as to have a thickness of about 1 µm between the buffer layer 112 and the n-type guide layer 113.

On the n-type guide layer 113, an active layer 114 is grown. The active layer 114 has an MQW (Multiple Quantum Well) structure in which three undoped quantum well layers of $In_{0.1}Ga_{0.99}N$ having a thickness of about 3.5 nm and undoped barrier layers of $In_{0.01}Ga_{0.99}N$ having a thickness of about 7 nm are alternately stacked so that each of the quantum well layers is sandwiched between the barrier layers. In this embodiment, the emission wavelength of the multiple quantum well structure is set to 405 nm, but can be can be varied from 380 nm to 550 nm by changing the composition or film thickness of the quantum well layer or barrier layer.

On the active layer 114, a first guide layer 115 made of p-type GaN is grown so as to have a thickness of 0.03 µm.

On the first guide layer 115, an overflow prevention layer 116 is grown. The overflow prevention layer 116 is a $Ga_{0.8}Al_{0.2}N$ layer doped with a p-type impurity element at a concentration of about $5\times10^{18}$ cm$^{-3}$ and having a thickness of about 10 nm, and functions as a layer for preventing the overflow of electrons. Examples of a p-type impurity to be used include Mg and Zn. In this embodiment, Mg is used.

On the overflow prevention layer 116, a second guide layer 117 made of p-type GaN is grown. In this embodiment, the second guide layer 117 is a GaN layer doped with a p-type impurity element at a concentration of about $5\times10^{18}$ cm$^{-3}$ to $10\times10^{18}$ cm$^{-3}$ and having a thickness of about 0.1 µm. More generally, for example, a p-type nitride-based III-V group compound semiconductor layer of $In_xGa_{1-x-y}Al_yN$ ($0 \leq x \leq 1$, $0 \leq y \leq 1$) may be used.

On the second guide layer 117, a p-type cladding layer 118 is grown. In this embodiment, the p-type cladding layer 118 is a superlattice composed of undoped $Ga_{0.9}Al_{0.1}N$ layers and p-type impurity-doped GaN layers. However, the p-type cladding layer 118 is not limited thereto, and may be, for example, a p-type impurity-doped thick film of $Ga_{0.95}Al_{0.05}N$ (film thickness: about 0.3 µm). As described above, in this embodiment, a superlattice composed of an undoped $Ga_{0.9}Al_{0.01}N$ and a p-type impurity-doped GaN is used as the p-type cladding layer 118, but both of $Ga_{0.9}Al_{0.1}N$ and GaN may be doped with a p-type impurity. Alternatively, a p-type impurity-doped GaN film having a thickness of about 0.3 µm may be used. It is to be noted that the p-type cladding layer 118 can be omitted if desired.

On the p-type cladding layer 118, a contact layer 119 made of p-type GaN is grown. In this embodiment, the contact layer 119 is a p-type impurity-dope GaN layer having a thickness of about 0.1 µm, but may be, for example, a p-type impurity-doped layer of $In_xGa_{1-x-y}Al_yN$ ($0 \leq x \leq 1$, $0 \leq y \leq 1$).

Such a wafer prepared by crystal growth is subjected to a device process to manufacture a light emitting diode.

Figure 4:
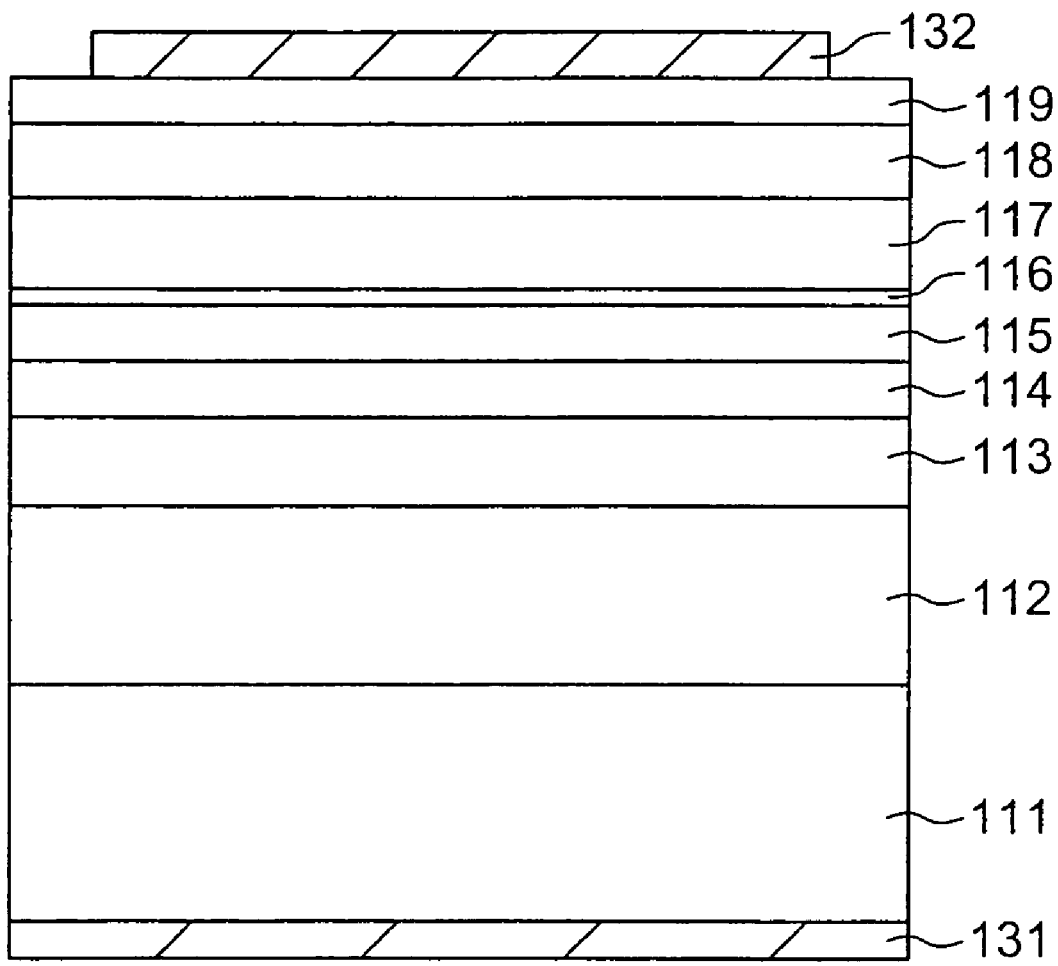
FIG. 4 is a schematic view which shows a cross-sectional structure of a semiconductor device (i.e., a light emitting diode) according to a second embodiment of the present invention.

As shown in FIG. 4, on the p-type GaN contact layer 119, a p-side electrode 132 formed from, for example, a composite film of palladium/platinum/gold (Pd/Pt/Au) is provided. The thicknesses of the Pd film, Pt film, and Au film are, for example, 0.05 µm, 0.05 µm, and 1.0 µm, respectively.

On the back surface of the n-type GaN substrate 111, an n-side electrode 131 formed from, for example, a composite film of titanium/platinum/gold (Ti/Pt/Au) is provided. The n-side electrode 131 can be formed from, for example, a Ti film having a thickness of 0.05 µm, a Pt film having a thickness of 0.05 µm, and an Au film having a thickness of 1.0 µm.

The {1-100} end faces or {11-20} end faces of the semiconductor device are formed by cleavage or dicing for element isolation. If such end faces are left as they are, air, organic or inorganic matter, and the like contaminate the end faces. Even if the semiconductor device can be sealed in a package with little influence of contaminants on the end faces, organic or inorganic matter is attracted to the end faces by light emitted from the light emitting diode by the passage of electric current. For this reason, it is necessary to provide some kind of a protective film on the end face or faces of the nitride-based III-V group compound semiconductor.

Therefore, as in the case of the first embodiment, a first protective layer made of AlN is formed on the {1-100} plane of the nitride-based III-V group compound semiconductor, and a second protective layer made of $Si_3N_4$ having a refractive index different from that of AlN is formed on the first protective layer. The AlN layer and the $Si_3N_4$ layer are formed by an ECR (Electron Cyclotron Resonance) sputtering method. It is to be noted that a method for forming such a nitride protective film is not limited to an ECR sputtering method, and other film formation methods may alternatively be employed.

As shown in FIG. 3, the film thickness of the protective film to be formed on the end face can be appropriately selected depending on a target reflectivity. For example, in a case where the thickness of the AlN layer is set to 0.25 nm and the thickness of the $Si_3N_4$ layer is set to 50 nm, the reflectivity of the end face is minimized so that light extraction efficiency is improved. Further, by forming a dielectric multilayer composed of films having different refractive indexes, such as $SiO_2$ and $ZrO_2$ films or $SiO_2$ and $Si_3N_4$ films on the $Si_3N_4$ layer having a thickness of 0.25 nm formed on the AlN layer having a thickness of 0.25 nm so that the reflectivity of the end face is increased to 90% or higher to avoid light emission from the end face, it is possible to extract light from the top or bottom surface of the light emitting diode, that is, from the surface where the electrode is provided.

The lifetime of the light emitting diode of this embodiment having the protective film comprising the first protective layer made of AlN and the second protective layer made Of $Si_3N_4$ was 3,000 hours or longer when measured at a constant operating current of 350 mA. Here, the lifetime was defined as the time that elapsed before the optical output of the light emitting diode was decreased to 90% of the initial value at a constant operating current of 350 mA.

As a comparative example, a light emitting diode was manufactured so as to have the same structure as the second embodiment except that the end face protective film was changed to an $Al_2O_3$ film. The lifetime of the light emitting diode of this comparative example was about 1,500 hours. From the result, it can be considered that as in the case of the first embodiment, the light emitting diode according to the second embodiment having the first protective layer made of AlN and the second protective layer made of $Si_3N_4$ can efficiently release heat generated in the semiconductor device to a sub-mount and the protective film itself has high resistance against oxidation and contamination with organic/inorganic matter.

As has been described above, as in the case of the first embodiment, the second embodiment can also provide a high-reliability semiconductor device.

It is to be noted that in the above description, the nitride protective film is formed on the {1-100} end face, but such a protective film can also be formed on the {11-20} end face obtained by element isolation.

In the first and second embodiments, the GaN substrate is used, but a substrate made of an insulating material, such as a sapphire substrate or a substrate made of another semiconductor material, such as an SiC substrate may alternatively be used. In a case where a substrate made of an insulating material, such as a sapphire substrate is used, an n-type semiconductor layer to be formed on the substrate can be used as an n-type contact layer.

As described above, in the first and second embodiments, the first protective layer is made of AlN and the second protective layer is made of $Si_3N_4$. That is, it is preferred that the first protective layer be formed using a material having a higher heat conductivity than that of the second protective layer and that the second protective layer be formed using a material having resistance to oxidation. For example, in a case where the first protective layer is formed using AlN, the second protective layer may be formed using $Si_xAl_{1-x}Ny$ ($0 \leq x \leq 1$, $0 \leq y \leq 1$) instead of $Si_3N_4$. Further, the first protective layer may be formed using $Si_xAl_{1-x}Ny$ ($0 \leq x \leq 1$, $0 \leq y \leq 1$) instead of AlN.

According to each of the embodiments of the present invention, it is possible to provide a high-reliability semiconductor device comprising nitride-based III-V group compound semiconductor layers.

The present invention is not limited to the examples described above, and can be applied to optical devices such as photodetectors and electronic devices such as field-effect transistors and heterojunction transistors, in addition to laser diodes and light emitting diodes.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A laser diode comprising:
    a substrate;
    a multi-layer film including a first conductivity type cladding layer provided on the substrate, a first conductivity type guide layer provided on the first conductivity type cladding layer, an active layer provided on the first conductivity type guide layer, a second conductivity type guide layer provided on the active layer, and a second conductivity type cladding layer provided on the second conductivity type guide layer, each of the layers being made of a nitride-based III-V group compound semiconductor;
    a first protective layer provided on a light emitting surface of the active layer configured to protect the light emitting surface, and is made of nitride including aluminum; and
    a second protective layer provided on the first protective layer configured to prevent the first protective layer from being oxidized, and is made of nitride including silicon, the second protective layer having a refractive index different from that of the first protective layer,
    wherein each of the first and second protective layers has a thickness of 0.25 nm or more but 50 nm or less.

2. The laser diode according to claim 1, wherein the first protective layer has a heat conductivity higher than that of the second protective layer.

3. The laser diode according to claim 1, wherein the first protective layer is made of aluminum nitride, and the second protective layer is made of silicon nitride.

4. The laser diode according to claim 1, wherein the first protective layer is provided on a {1-100} plane.

5. The laser diode according to claim 1, wherein the substrate is a GaN substrate.

6. The laser diode according to claim 1, wherein the first conductivity type is an n-type and the second conductivity type is a p-type.

7. A light emitting diode comprising:
    a substrate;
    a multi-layer film including a first conductivity type semiconductor layer provided on the substrate, an active layer provided on the first conductivity type semiconductor layer, and a second conductivity type semiconductor layer provided on the active layer, each of the layers being made of a nitride-based III-V group compound semiconductor;
    a first protective layer provided on a side surface of the active layer configured to protect the side surface of the active layer, and is made of nitride including aluminum; and
    a second protective layer provided on the first protective layer configured to prevent the first protective layer from being oxidized, and is made of nitride including silicon, the second protective layer having a refractive index different from that of the first protective layer,
    wherein each of the first and second protective layers has a thickness of 0.25 nm or more but 50 nm or less.

8. The light emitting diode according to claim 7, wherein the first protective layer has a heat conductivity higher than that of the second protective layer.

9. The light emitting diode according to claim 7, wherein the first protective layer is made of aluminum nitride, and the second protective layer is made of silicon nitride.

10. The light emitting diode according to claim 7, wherein the first protective layer is provided on a {1-100} plane.

11. The light emitting diode according to claim 7, wherein the substrate is a GaN substrate.

12. The light emitting diode according to claim 7, wherein the first conductivity type is an n-type and the second conductivity type is a p-type.

13. A semiconductor device comprising:
    a nitride-based III-V group compound semiconductor layer provided on a substrate;
    a first protective layer provided on a side face of the nitride-based III-V group compound semiconductor layer configured to protect the side face of the nitride-based III-V group compound semiconductor layer, and made of nitride including aluminum; and
    a second protective layer provided on the first protective layer configured to prevent the first protective layer from being oxidized, and is made of nitride including silicon, the second protective layer having a refractive index different from that of the first protective layer,
    wherein each of the first and second protective layers has a thickness of 0.25 nm or more but 50 nm or less.

14. The semiconductor device according to claim 13, wherein the first protective layer has a heat conductivity higher than that of the second protective layer.

15. The semiconductor device according to claim 13, wherein the first protective layer is made of aluminum nitride, and the second protective layer is made of silicon nitride.

16. The semiconductor device according to claim 13, wherein the first protective layer is provided on a {1-100} plane.

17. The semiconductor device according to claim 13, wherein the substrate is a GaN substrate.

18. A method for manufacturing a semiconductor device comprising:

forming nitride-based III-V group compound semiconductor layers on a substrate;

forming a first protective layer on a side face of the nitride-based III-V group compound semiconductor layers to protect the side face of the nitride-based III-V group compound semiconductor layers, the first protective layer being made of nitride including aluminum, and having a thickness of 0.25 nm or more but 50 nm or less; and forming a second protective layer having a refractive index different from that of the first protective layer on the first protective layer to prevent the first protective layer from being oxidized, the second protective layer being made of nitride including silicon, and having a thickness of 0.25 nm or more but 50 nm or less.

19. The method for manufacturing a semiconductor device according to claim 18, wherein the first and second protective layers are formed by an ECR sputtering method.

20. The laser diode according to claim 1, wherein the first protective layer is made of silicon aluminum nitride, and the second protective layer is made of silicon nitride.

21. The light emitting diode according to claim 7, wherein the first protective layer is made of silicon aluminum nitride, and the second protective layer is made of silicon nitride.

22. The semiconductor device according to claim 13, wherein the first protective layer is made of silicon aluminum nitride, and the second protective layer is made of silicon nitride.

* * * * *